(12) United States Patent
Kim et al.

(10) Patent No.: US 11,195,466 B2
(45) Date of Patent: *Dec. 7, 2021

(54) DISPLAY DEVICE HAVING GATE BRIDGES CONNECTING SCAN GATE LINES TO PIXELS AND METHOD FOR DRIVING THE SAME

(71) Applicant: SAMSUNG DISPLAY CO., LTD., Yongin-si (KR)

(72) Inventors: Soon-Dong Kim, Osan-si (KR); Il-Joo Kim, Hwaseong-si (KR); Jun Ki Jeong, Anyang-si (KR); Jin-Wook Yang, Suwon-si (KR); Gyung Soon Park, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/872,261

(22) Filed: May 11, 2020

(65) Prior Publication Data

US 2020/0273408 A1    Aug. 27, 2020

Related U.S. Application Data

(63) Continuation of application No. 15/863,148, filed on Jan. 5, 2018, now Pat. No. 10,650,748.

(30) Foreign Application Priority Data

Sep. 13, 2017    (KR) .................. 10-2017-0117251

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3225* (2013.01); *G09G 3/3233* (2013.01);
(Continued)

(58) Field of Classification Search
CPC .. G09G 3/3258; G09G 3/3233; G09G 3/3225; G09G 3/3266; G09G 3/3291;
(Continued)

(56) References Cited

U.S. PATENT DOCUMENTS 9,395,592 B2    7/2016  Seo et al.
10,650,748 B2 *  5/2020  Kim ..................... G09G 3/3266
(Continued)

FOREIGN PATENT DOCUMENTS

KR    10-2017-0031323 A    3/2017

OTHER PUBLICATIONS

EPO Partial Search Report dated Jul. 5, 2018, for corresponding European Patent Application No. 18170277.0 (14 pages).
(Continued)

*Primary Examiner* — Rodney Amadiz
(74) *Attorney, Agent, or Firm* — Lewis Roca Rothgerber Christie LLP

(57) ABSTRACT

Example embodiments of the present disclosure provide a display device including: a plurality of pixels; a first scan gate line and a second scan gate line configured to transfer scan signals to a first pixel row of the pixels; a plurality of first gate bridges connected with the first scan gate line to transfer the scan signals to a plurality of first pixels at the first pixel row; a plurality of second gate bridges connected with the second scan gate line to transfer the scan signals to a plurality of second pixels at the first pixel row; a plurality of first data lines configured to supply a plurality of data voltages corresponding to the first pixels; and a plurality of second data lines configured to supply a plurality of data (Continued)

voltages corresponding to the second pixels, wherein two of the first data lines are positioned between two first pixels corresponding thereto, and two of the second data lines are positioned between two second pixels corresponding thereto.

20 Claims, 10 Drawing Sheets

(51) Int. Cl.
*G09G 3/3291* (2016.01)
*H01L 27/32* (2006.01)
*G09G 3/3233* (2016.01)
*G09G 3/3225* (2016.01)
*H01L 27/12* (2006.01)

(52) U.S. Cl.
CPC ......... *G09G 3/3266* (2013.01); *G09G 3/3291* (2013.01); *H01L 27/3262* (2013.01); *H01L 27/3276* (2013.01); G09G 2300/0426 (2013.01); G09G 2300/0452 (2013.01); G09G 2300/0819 (2013.01); G09G 2300/0842 (2013.01); G09G 2300/0861 (2013.01); G09G 2310/0251 (2013.01); G09G 2310/0262 (2013.01); G09G 2310/0297 (2013.01); *G09G 2320/0223* (2013.01); *G09G 2320/043* (2013.01); *H01L 27/124* (2013.01)

(58) Field of Classification Search
CPC ... G09G 2310/0251; G09G 2300/0842; G09G 2310/0297; G09G 2300/0452; G09G 2300/0819; G09G 2300/0861; G09G 2310/0262; G09G 2320/0223; G09G 2300/0426; G09G 2320/043; H01L 27/3262; H01L 27/3276; H01L 27/124
See application file for complete search history.

(56) References Cited

U.S. PATENT DOCUMENTS

| | | |
|---|---|---|
| 2011/0163329 A1 | 7/2011 | Kim et al. |
| 2016/0093260 A1 | 3/2016 | Watsuda |
| 2016/0307981 A1 | 10/2016 | Jung |
| 2017/0069271 A1 | 3/2017 | Kim et al. |
| 2017/0221979 A1 | 8/2017 | Chae |

OTHER PUBLICATIONS

EPO Extended Search Report dated Oct. 18, 2018, for corresponding European Patent Application No. 18170277.0 (14 pages).

* cited by examiner

DISPLAY DEVICE HAVING GATE BRIDGES CONNECTING SCAN GATE LINES TO PIXELS AND METHOD FOR DRIVING THE SAME

CROSS-REFERENCE TO RELATED APPLICATIONS

This application is a continuation of U.S. patent application Ser. No. 15/863,148, filed Jan. 5, 2018, which claims priority to and the benefit of Korean Patent Application No. 10-2017-0117251, filed Sep. 13, 2017, the entire content of both of which is incorporated herein by reference.

BACKGROUND

1. Field

The present disclosure relates to a display apparatus and a driving method thereof.

2. Description of the Related Art

Parasitic capacitance may exist between two adjacent data lines (e.g., due to their proximity). After a data voltage is written to a first line of two adjacent data lines, the data voltage may be transferred to a second line of the two adjacent data lines. In such a case, undesired coupling by parasitic capacitance occurs, and a voltage change of the second data line may affect the data line to which the data voltage is written.

Thus, the voltage of the written data line may fluctuate, and when the two adjacent data lines are in a display apparatus, image quality deterioration such as stain defects may occur.

The above information disclosed in this Background section is only for enhancement of understanding of the background of the invention and therefore it may contain information that does not form prior art.

SUMMARY

The present disclosure provides a display device and a driving method thereof capable of reducing or minimizing undesired coupling caused by parasitic capacitance, in order to reduce or prevent image quality deterioration.

Some embodiments of the present invention provide a display device including: a plurality of pixels; a first scan gate line and a second scan gate line configured to transfer scan signals to a first pixel row of the pixels; a plurality of first gate bridges connected with the first scan gate line to transfer the scan signals to a plurality of first pixels at the first pixel row; a plurality of second gate bridges connected with the second scan gate line to transfer the scan signals to a plurality of second pixels at the first pixel row; a plurality of first data lines configured to supply a plurality of data voltages corresponding to the first pixels; and a plurality of second data lines configured to supply a plurality of data voltages corresponding to the second pixels, wherein two of the first data lines are positioned between two first pixels corresponding thereto, and two of the second data lines are positioned between two second pixels corresponding thereto.

Some embodiments of the present invention provide a display device including: a first scan gate line configured to transfer a first scan signal; a second scan gate line configured to transfer a second scan signal; a first gate bridge connected with the first scan gate line to transfer the first scan signal to two corresponding first pixels; a second gate bridge connected with the second scan gate line to transfer the second scan signal to two corresponding second pixels; two first data lines positioned between the two first pixels and connected with the two first pixels, respectively; and two second data lines positioned between the two second pixels and connected with the two second pixels, respectively, wherein the two first pixels and the two second pixels are positioned at a same pixel row.

Some embodiments of the present invention provide a driving method of a display device, including: transferring a first scan signal of an enable level to a first pixel and a second pixel through a first gate bridge connected with a first scan gate line; transferring a first data voltage and a second data voltage to a first data line connected with the first pixel and a second data line connected with the second pixel, positioned between the first pixel and the second pixel, during a first period of an enable period of the first scan signal; transferring a second scan signal of an enable level to a third pixel and a fourth pixel through a second gate bridge connected with a second scan gate line; and transferring a third data voltage and a fourth data voltage to a third data line connected with the third pixel and a fourth data line connected with the fourth pixel, positioned between the third pixel and the fourth pixel, during a second period of an enable period of the second scan signal, wherein the first to fourth pixels are positioned at a same pixel row.

According to some embodiments, it is possible to provide a display device and a driving method thereof capable of reducing or minimizing undesired coupling caused by parasitic capacitance, in order to reduce or prevent image quality deterioration.

DETAILED DESCRIPTION

Figure 1:
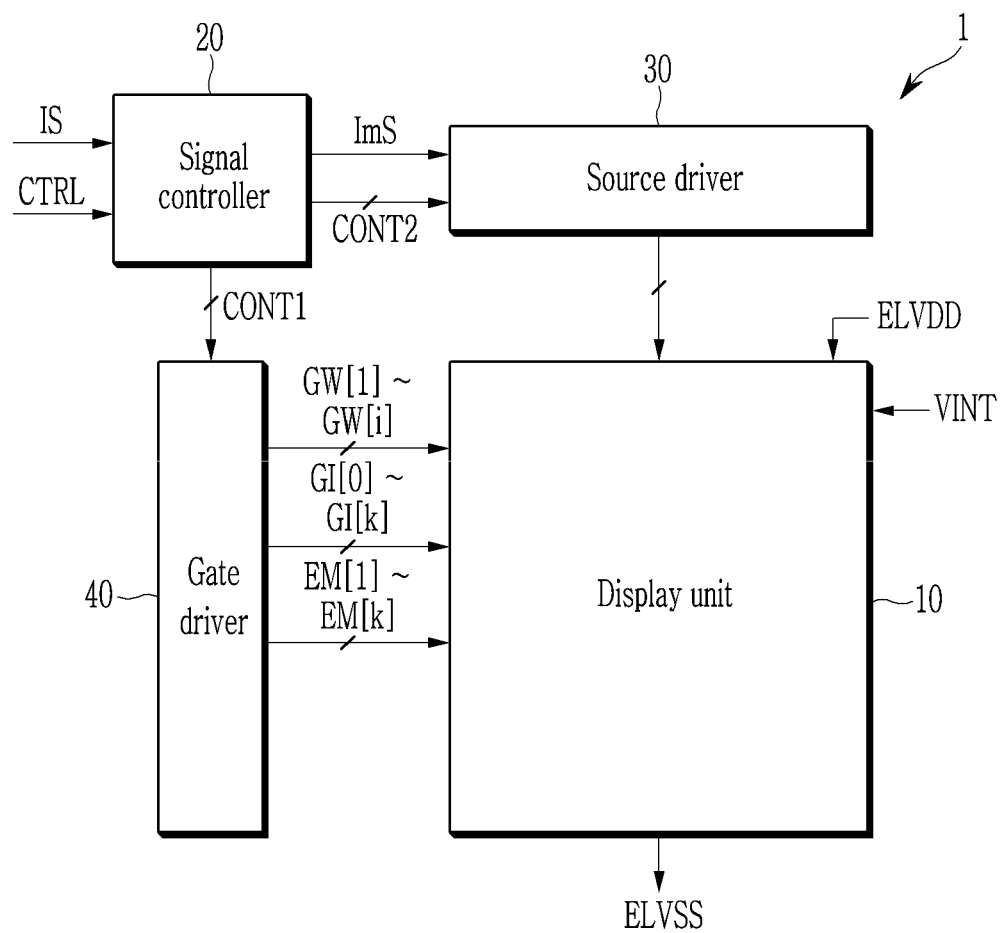
FIG. 1 is a block diagram illustrating a display device according to some embodiments.

Hereinafter, example embodiments will now be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the drawings, thicknesses of a plurality of areas may be illustrated in an enlarged manner for clarity and ease of description thereof.

It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that when an area or element is referred to as being "on," "connected to," or "coupled to" another area or element, it may be directly on, connected, or coupled to the other area or element, or intervening areas or elements may be present therebetween. Conversely, when an area or element is referred to as being "directly on," "directly connected to," or "directly coupled to" another area or element, there are no intervening areas or elements therebetween. In addition, it will also be understood that when an area or element is referred to as being "between" two areas or elements, it can be the only area or element between the two areas or elements, or one or more intervening areas or elements may also be present.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

When a certain embodiment may be implemented differently, a specific process order may be performed differently from the described order. For example, two consecutively described processes may be performed substantially at the same time or performed in an order opposite to the described order.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

FIG. 1 is a block diagram illustrating a display device according to some embodiments.

Referring to FIG. 1, the display device 1 includes a display unit 10, a signal controller 20, a source driver 30, and a gate driver 40.

In the display unit 10, a plurality of data lines may extend substantially in a column direction to be substantially parallel to each other, and a plurality of gate lines may extend substantially in a row direction to be substantially parallel to each other. Two power voltages ELVDD and ELVSS and an initialization voltage VINT for driving a plurality of pixels may be supplied to the display unit 10. The display unit 10 will be described in further detail with reference to FIG. 2.

The signal controller 20 receives an image signal IS inputted into the signal controller 20 from the outside, and receives an input control signal CTRL for controlling the display thereof. The image signal IS may include information indicating each gray level (e.g., brightness) of a plurality of pixels of the display unit 10. The input control signal CTRL may include a vertical synchronization signal, a horizontal synchronizing signal, a main clock signal, and the like. The signal controller 20 generates a gate driving control signal CONT1, a source driving control signal CONT2, and an image data signal ImS, depending on the image signal IS, a horizontal synchronizing signal, a vertical synchronization signal, and a main clock signal.

The signal controller 20 performs image processing on the image signal IS in accordance with operating conditions of the display unit 10 and the source driver 30, based on the inputted image signal IS and the input control signal CTRL. For example, when the pixels of the display unit 10 have a pentile structure (e.g., instead of an RGB pixel structure having the same number of red, blue, and green pixels), the signal controller 20 may convert the image signal IS based on an RGB pixel structure into an image data signal ImS that is appropriate for a pentile structure. In addition, the signal controller 20 may compensate the image signal IS through an image processing process such as gamma correction and luminance compensation.

The signal controller 20 transfers the gate driving control signal CONT1 to the gate driver 40, and transfers the source driving control signal CONT2 and the image data signal ImS to the source driver 30.

The signal controller 20 generates a plurality of data voltages based on the image data signal ImS, to transfer them to a plurality of data lines depending on the source driving control signal CONT2.

For example, the source driver 30 samples and holds the inputted image data signal ImS depending on the source driving control signal CONT2, and converts the held image data signal ImS signal into a data voltage to latch a plurality of data voltages. The source driver 30 transfers the data voltages to corresponding data lines. The data voltages are latched in synchronization with a data supply time point controlled depending on the source driving control signal CONT2.

The gate driver 40 may generate a plurality of scan signals GW[1]-GW[i], a plurality of initialization signals GI[0]-GI[k], and a plurality of emission control signals EM[1]-EM[k], depending on the gate driving control signal CONT1. A data voltage may be written to corresponding pixels depending on the scan signals GW[1]-GW[i]. In addition, initialization operations of the corresponding pixels may be performed depending on the initialization signals GI[0]-GI[k], and emission periods of the corresponding pixels may be controlled depending on the emission control signals EM[1]-EM[k].

Figure 2:
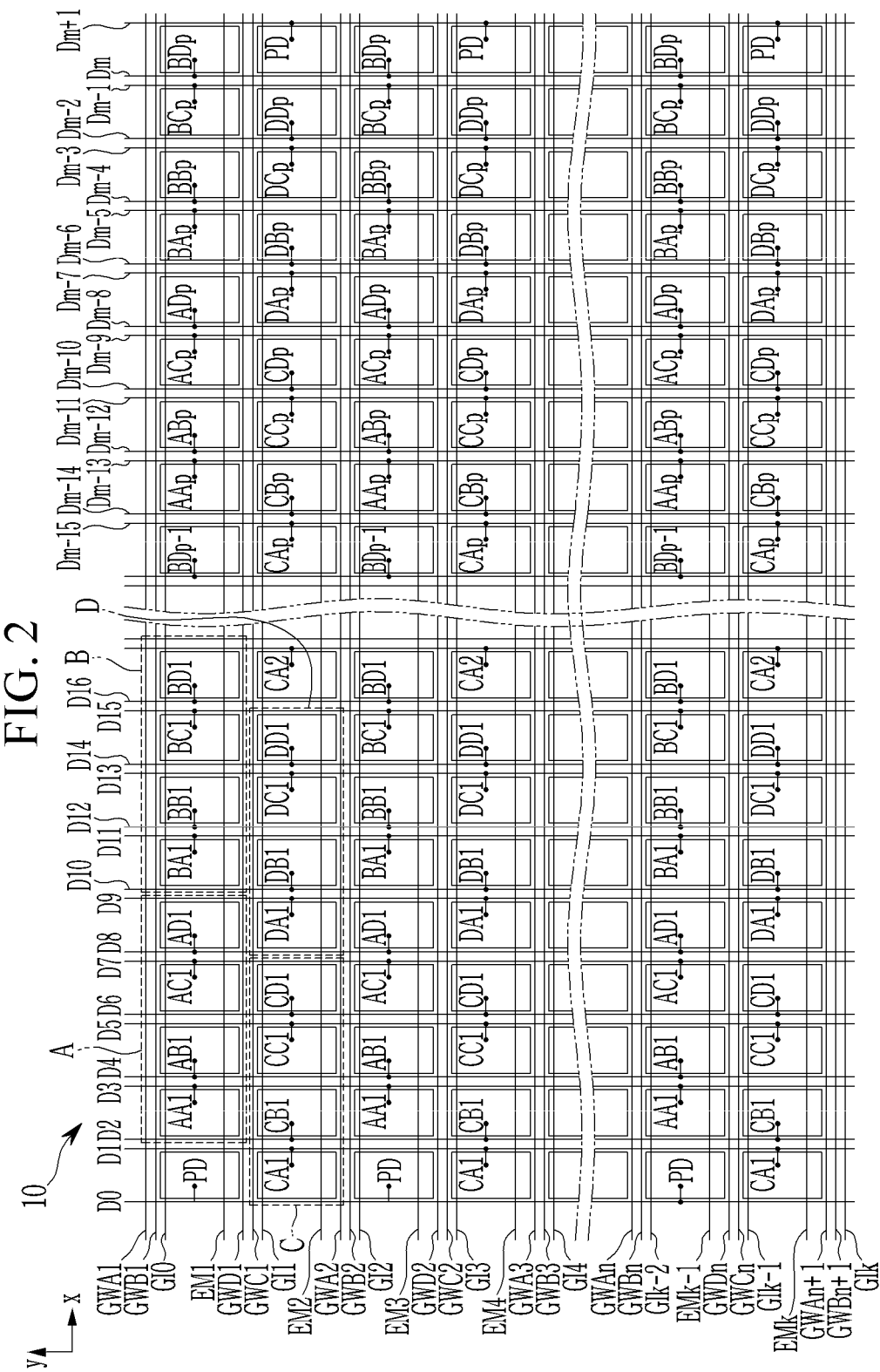
FIG. 2 illustrates a display unit according to some embodiments.

FIG. 2 illustrates a display unit according to some embodiments.

Referring to FIG. 2, the display unit 10 includes a plurality of data lines D0-D(m+1), a plurality of scan gate lines GWA1-GWAn, GWB1-GWBn, GWC1-GWCn, GWD1-GWDn, a plurality of initialization lines GI0-GIk, a plurality of emission control signals EM1-EMk, and a plurality of pixels AA, AB, AC, AD, BA, BB, BC, BD, CA, CB, CC, CD, DA, DB, DC, and DD. In FIG. 2, the pixels may be divided into groups of pixels, including an A pixel group, a B pixel group, a C pixel group, and a D pixel group.

The A pixel group (e.g., A) includes four pixels (e.g., AA1, AB1, AC1, and AD1) to which data voltages are written depending on scan signals transferred through a first scan gate line GWA. The B pixel group (e.g., B) is positioned in the same pixel row as that of the A pixel group, and includes four pixels (e.g., BA1, BB1, BC1, and BD1) to which data voltages are written depending on scan signals transferred through a second scan gate line GWB. The C pixel group (e.g., C) includes four pixels (e.g., CA1, CB1, CC1, and CD1) to which data voltages are written depending on scan signals transferred through a third scan gate line GWC. The D pixel group (e.g., D) is positioned in the same pixel row as that of the C pixel group, and includes four pixels (e.g., DA1, DB1, DC1, and DD1) to which data voltages are written depending on scan signals transferred through a fourth scan gate line GWD.

Although the number of pixels belonging to one pixel group is described as four in the present disclosure, the present invention is not limited thereto or thereby, and the number of pixels in a pixel group may vary depending on the pentile structure. For example, the A pixel group and the B pixel group shown in FIG. 2 may follow a pentile structure "GBGR" arranged in the order of a green pixel, a blue pixel, a green pixel, and a red pixel. The C pixel group and the D pixel group shown in FIG. 2 may follow a pentile structure "BGRG" arranged in the order of a blue pixel, a green pixel, a red pixel, and a green pixel. When the number of pixels constituting the pentile structure is changed, the number of pixels belonging to the pixel group may also be changed.

Pixels belonging to a plurality of A pixel groups in the first pixel row are denoted by AA1, AB1, AC1, AD1, ..., AAp, ABp, ACp, and ADp, and pixels belonging to a plurality of A pixel groups in other pixel rows are also indicated by the same reference symbols. Scan signals are transferred to the A pixel groups through a corresponding one of the scan gate lines GWA1-GWAn, and data voltages are transferred to a corresponding one of a plurality of data lines D3, D4, D7, D8, ..., Dm−13, Dm−12, Dm−9, and Dm−8.

Specifically, scan signals are transferred to a plurality of pixels AA1, AB1, AC1, AD1, ..., AAp, ABp, ACp, and ADp belonging to the A pixel groups of the first pixel row through the scan gate line GWA1. The pixel AA1 is connected with the data line D3, the pixel AB1 is connected with the data line D4, the pixel AC1 is connected with the data line D7, and the pixel AD1 is connected with the data line D8. The pixel AAp is connected with the data line Dm−13, the pixel ABp is connected with the data line Dm−12, the pixel ACp is connected with the data line Dm−9, and the pixel ADp is connected with the data line Dm−8. As such, the data lines connected with the A pixel groups are positioned between two adjacent pixels corresponding to each other in the A pixel groups in two units.

Pixels belonging to a plurality of B pixel groups in the first pixel row are denoted by BA1, BB1, BC1, BD1, ..., BAp, BBp, BCp, and BDp, and pixels belonging to a plurality of B pixel groups in other pixel rows are also indicated by the same reference symbols. Scan signals are transferred to the B pixel groups through a corresponding one of the scan gate lines GWB1-GWBn, and data voltages are transferred to a corresponding one of a plurality of data lines D11, D12, D15, D16, ..., Dm−5, Dm−4, Dm−1, and Dm.

Specifically, scan signals are transferred to a plurality of pixels BA1, BB1, BC1, BD1, ..., BAp, BBp, BCp, and BDp belonging to the B pixel groups of the first pixel row through the scan gate line GWB1. The pixel BA1 is connected with the data line D11, the pixel BB1 is connected with the data line D12, the pixel BC1 is connected with the data line D15, and the pixel BD1 is connected with the data line D16. The pixel BAp is connected with the data line Dm−5, the pixel BBp is connected with the data line Dm−4, the pixel BCp is connected with the data line Dm−1, and the pixel BDp is connected with the data line Dm. The data lines connected with the B pixel groups are positioned between two adjacent pixels corresponding to each other in the B pixel groups in two units.

Pixels belonging to a plurality of C pixel groups in the first pixel row are denoted by CA1, CB1, CC1, CD1, ..., CAp, CBp, CCp, and CDp, and pixels belonging to a plurality of C pixel groups in other pixel rows are also indicated by the same reference symbols. Scan signals are transferred to the C pixel groups through a corresponding one of the scan gate lines GWC1-GWCn, and data voltages are transferred to a corresponding one of a plurality of data lines D1, D2, D5, D6, ..., Dm−15, Dm−14, Dm−11, and Dm−10.

Specifically, scan signals are transferred to a plurality of pixels CA1, CB1, CC1, CD1, ..., CAp, CBp, CCp, and CDp belonging to the C pixel groups of the second pixel row through the scan gate line GWC1. The pixel CA1 is connected with the data line D1, the pixel CB1 is connected with the data line D2, the pixel CC1 is connected with the data line D5, and the pixel CD1 is connected with the data line D6. The pixel CAp is connected with the data line Dm−15, the pixel CBp is connected with the data line Dm−14, the pixel CCp is connected with the data line Dm−11, and the pixel CDp is connected with the data line Dm−10. The data lines connected with the C pixel groups are positioned between two adjacent pixels corresponding to each other in the C pixel groups in two units.

Pixels belonging to a plurality of D pixel groups in the first pixel row are denoted by DA1, DB1, DC1, DD1, . . . , DAp, DBp, DCp, and DDp, and pixels belonging to a plurality of D pixel groups in other pixel rows are also indicated by the same reference symbols. Scan signals are transferred to the D pixel groups through a corresponding one of the scan gate lines GWD1-GWDn, and data voltages are transferred to a corresponding one of a plurality of data lines D9, D10, D13, D14, . . . , Dm−7, Dm−6, Dm−3, and Dm−2.

Specifically, scan signals are transferred to a plurality of pixels DA1, DB1, DC1, DD1, . . . , DAp, DBp, DCp, and DDp belonging to the D pixel groups of the second pixel row through the scan gate line scan gate line GWD1. The pixel DA1 is connected with the data line D9, the pixel DB1 is connected with the data line D10, the pixel DC1 is connected with the data line D13, and the pixel DD1 is connected with the data line D14. The pixel DAp is connected with the data line Dm−7, the pixel DBp is connected with the data line Dm−6, the pixel DCp is connected with the data line Dm−3, and the pixel DDp is connected with the data line Dm−2. The data lines connected with the D pixel groups are positioned between two adjacent pixels corresponding to each other in the D pixel groups in two units.

A structure in which a plurality of scan signals are transferred to a plurality of A, B, C, and D pixel groups through the plurality of scan gate lines GWA1 to GWAn, GWB1 to GWBn, GWC1 to GWCn, and GWD1 to GWDn, will be described in further detail below.

In FIG. 2, the C pixel group is shifted to the left by one pixel as compared with the A pixel group adjacent to the C pixel group in the pixel column direction. Similarly, the D pixel group is shifted to the left by one pixel as compared with the B pixel group adjacent to the D pixel group in the pixel column direction. The A pixel group and the C pixel group are arranged in a zigzag pattern in the pixel column direction, and the B pixel group and the D pixel group are also arranged in a zigzag pattern. As such, the A, B, C, and D pixel groups are disposed and positioned between two pixels to which two data lines are connected. Consequently, an effect of the coupling caused by parasitic capacitance between two data lines of the adjacent pixel groups may be reduced.

The A, B, C, and D pixel groups are arranged in the zigzag pattern such that dummy pixels PD may be positioned in the display unit 10. As shown in FIG. 2, a dummy pixel PD may be positioned in the first column in the first pixel row, and a dummy pixel PD may be positioned in the $m^{th}$ column in the second pixel row. In addition, dummy data lines D0 and Dm+1 connected with the dummy pixels PD may be positioned in the display unit 10.

In FIG. 2, two dummy scan gate lines GWAn+1 and GWBn+1 are positioned adjacent to an initialization line GIk. The prevent invention is not limited thereto, and the initialization line GIk may be positioned without positioning the two dummy scan gate lines GWAn+1 and GWBn+1.

A plurality of initialization signals GI[0]-GI[k] may be sequentially supplied to a plurality of pixel rows through a plurality of initialization lines GI0-GIk. The initialization signals (e.g., GI[0] and GI[1]) transferred through two adjacent ones (e.g., GI0 and GI1) of the initialization lines GI[0]-GI[k] may be involved in initializing a plurality of pixels of one pixel row (e.g., the first pixel row). An initialization operation will be described in more detail below.

A plurality of emission control signals EM[1]-EM[k] may be sequentially supplied to the pixel rows through a plurality of emission control signals EM1-EMk. An emission control signal (e.g., EM[1]) transferred through one (e.g., EM1) of the emission control signals EM1-EMk may control emission periods of the pixels included in one pixel row (e.g., the first pixel row). An emission control operation will be described in more detail below.

Figure 3:
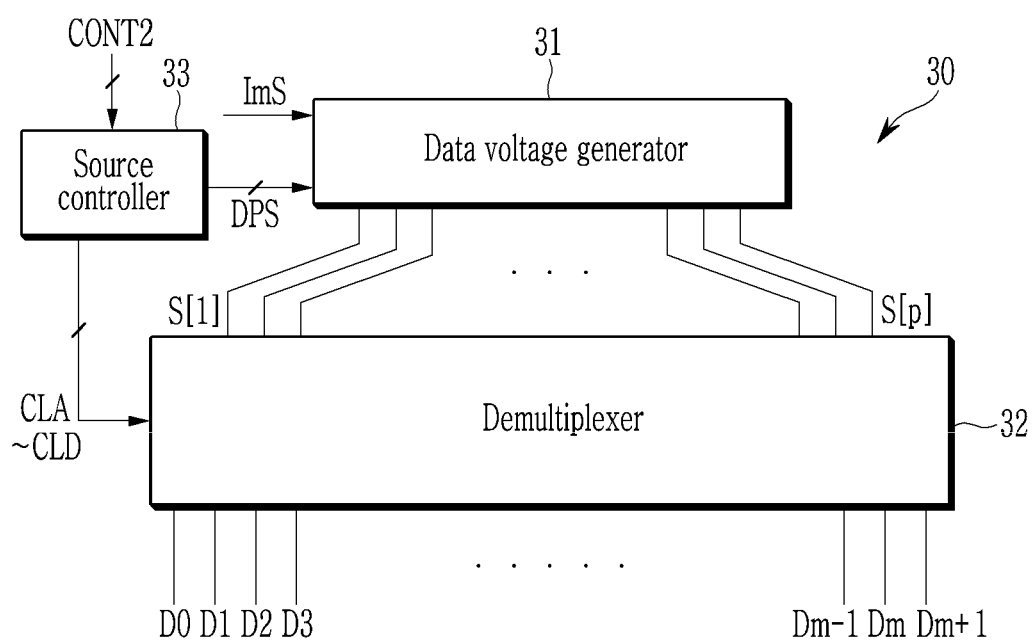
FIG. 3 is a block diagram illustrating a configuration of a source driver according to some embodiments.

FIG. 3 is a block diagram illustrating a configuration of a source driver according to some embodiments.

As shown in FIG. 3, the source driver 30 includes a data voltage generator 31, a demultiplexer 32, and a source controller 33.

The source controller 33 receives the source driving control signal CONT2 to generate a data processing signal DPS for controlling operation of the data voltage generator 31, and demultiplexing control signals CLA, CLB, CLC, and CLD for controlling operation of the demultiplexer 32.

The data voltage generator 31 samples and holds the image data signal ImS depending on the data processing signal DPS, and divides the held signal within a pixel unit and converts the signal into an analog voltage to latch it. The data voltage generator 31 transfers a plurality of source voltages S[1]-S[p] to the demultiplexer 32, wherein the source voltages S[1]-S[p] are latched depending on the data processing signal DPS. The data processing signal DPS may include a plurality of clock signals for controlling the operation of the data voltage generator 31 as above.

The demultiplexer 32 receives a plurality of source voltages S[1]-S[p], and transfers the source voltages S[1]-S[p] as a plurality of data voltages to a plurality of corresponding data lines, depending on the demultiplexing control signals CLA, CLB, CLC, and CLD.

Figure 4:
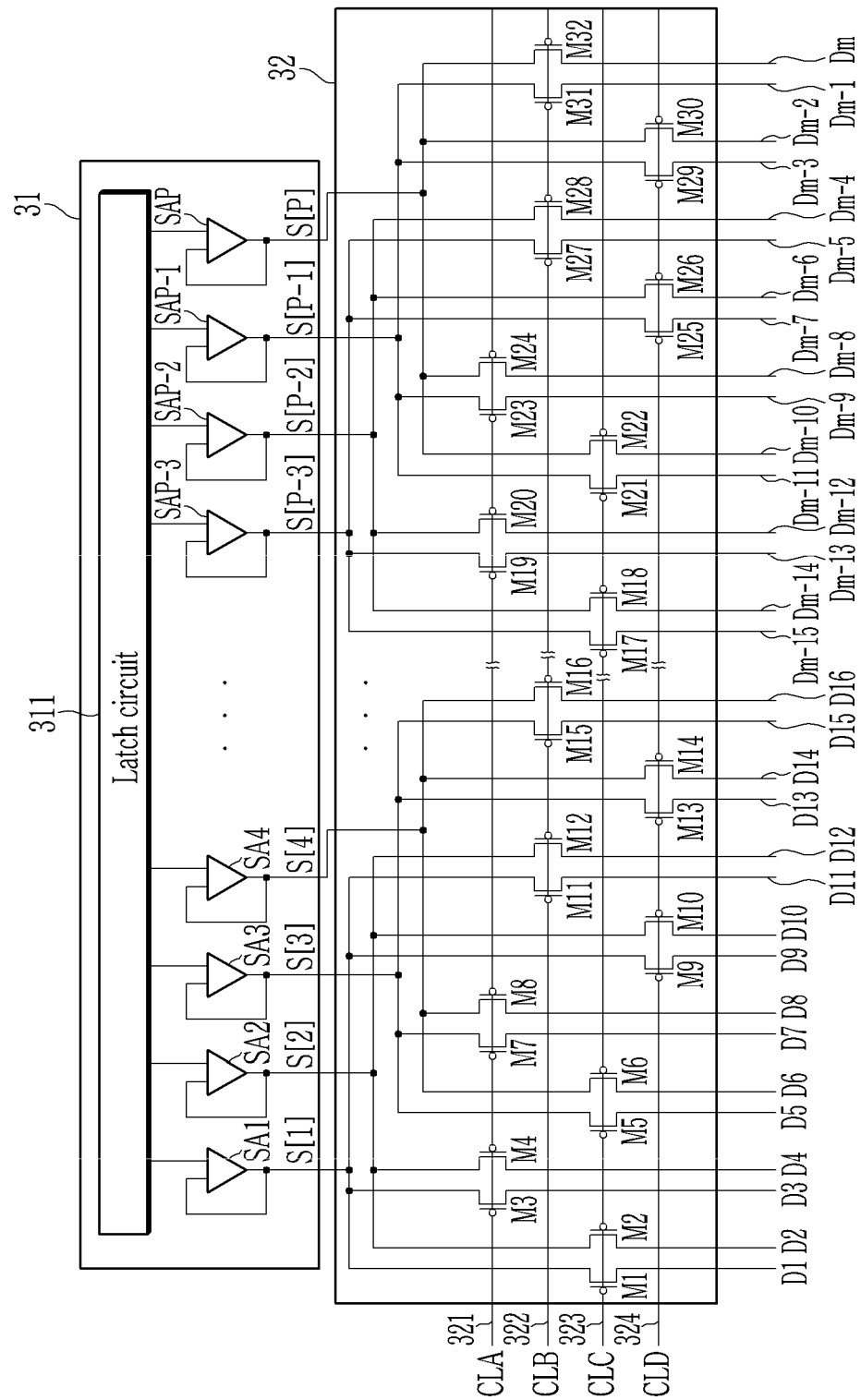
FIG. 4 illustrates a part of a configuration of a source driver.

FIG. 4 illustrates a part of a configuration of a source driver.

As shown in FIG. 4, a plurality of source voltages S[1]-S[p] are transferred from a latch circuit 311 of the source driver 31 to the demultiplexer 32 through a plurality of amplifiers SA1-SAp. A first one of two input terminals of each of the amplifiers SA1-SAp is electrically connected to an output terminal thereof, and the source voltages S[1]-S[p] are inputted from the latch circuit 311 into a second one of the two input terminals of the amplifiers SA1-SAp. As a result, the amplifiers SA1-SAp transfer the source voltages S[1]-S[p] inputted from the latch circuit 311.

In the demultiplexer 32 illustrated in FIG. 4, a plurality of switches M1-M32 connected with a plurality of data lines D1-D16 and Dm−15 Dm are illustrated, and each of the switches M1-M32 is illustrated as a P-channel type of transistor. However, the present invention is not limited thereto or thereby, and various structures in which a plurality of source voltages S[1]-S[p] are transferred as a plurality of data voltages to a plurality of data lines D1-Dm depending on the demultiplexing control signal CLA, CLB, CLC, and CLD are possible.

Each source electrode of a plurality of transistors M3, M4, M7, M8, M19, M20, M23, and M24 is connected with an output terminal of a corresponding one of a plurality of amplifiers SA1, SA2, SA3, SA4, SAp−3, SAp−2, SAp−1, and SAp. In addition, each drain electrode of the transistors M3, M4, M7, M8, M19, M20, M23, and M24 is connected with a corresponding one of a plurality of data lines D3, D4, D7, D8, Dm−13, Dm−12, Dm−9, and Dm−8, and each gate electrode of the transistors M3, M4, M7, M8, M19, M20, M23, and M24 is connected with a wire 321 to which the demultiplexing control signal CLA is transferred. Accordingly, when the demultiplexing control signal CLA is in a low level which is an enable level, the transistors M3, M4, M7, M8, M19, M20, M23, and M24 are turned on such that the source voltages S[1]-S[p], as a plurality of data voltages, are transferred to the corresponding data lines.

Each source electrode of a plurality of transistors M11, M12, M15, M16, M27, M28, M31, and M32 is connected with an output terminal of a corresponding one of a plurality of amplifiers SA1, SA2, SA3, SA4, SAp-3, SAp-2, SAp-1, and SAp. In addition, each drain electrode of the transistors M11, M12, M15, M16, M27, M28, M31, and M32 is connected with a corresponding one of a plurality of data lines D11, D12, D15, D16, Dm-5, Dm-4, Dm-1, and Dm, and each gate electrode of the transistors M11, M12, M15, M16, M27, M28, M31, and M32 is connected with a wire 322 to which the demultiplexing control signal CLB is transferred. Accordingly, when the demultiplexing control signal CLB is in a low level which is the enable level, the plurality of transistors M11, M12, M15, M16, M27, M28, M31, and M32 are turned on such that the source voltages S[1]-S[p], as a plurality of data voltages, are transferred to the corresponding data lines.

Each source electrode of a plurality of transistors M1, M2, M5, M6, M17, M18, M21, and M22 is connected with an output terminal of a corresponding one of a plurality of amplifiers SA1, SA2, SA3, SA4, SAp-3, SAp-2, SAp-1, and SAp. In addition, each drain electrode of the plurality of transistors M1, M2, M5, M6, M17, M18, M21, and M22 is connected with a corresponding one of a plurality of data lines D1, D2, D5, D6, Dm-15, Dm-14, Dm-11, and Dm-10, and each gate electrode of the plurality of transistors M1, M2, M5, M6, M17, M18, M21, and M22 is connected with a wire 323 to which the demultiplexing control signal CLC is transferred. Accordingly, when the demultiplexing control signal CLC is in a low level which is the enable level, the plurality of transistors M1, M2, M5, M6, M17, M18, M21, and M22 are turned on such that the source voltages S[1]-S[p] as a plurality of data voltages are transferred to the corresponding data lines.

Each source electrode of a plurality of transistors M9, M10, M13, M14, M25, M26, M29, and M30 is connected with an output terminal of a corresponding one of a plurality of amplifiers SA1, SA2, SA3, SA4, SAp-3, SAp-2, SAp-1, and SAp. In addition, each drain electrode of the plurality of transistors M9, M10, M13, M14, M25, M26, M29, and M30 is connected with a corresponding one of a plurality of data lines D9, D10, D13, D14, Dm-7, Dm-6, Dm-3, and Dm-2, and each gate electrode of the plurality of transistors M9, M10, M13, M14, M25, M26, M29, and M30 is connected with a wire 324 to which the demultiplexing control signal CLD is transferred. Accordingly, when the demultiplexing control signal CLD is in a low level which is the enable level, the plurality of transistors M9, M10, M13, M14, M25, M26, M29, and M30 are turned on such that the source voltages S[1]-S[p], as a plurality of data voltages, are transferred to the corresponding data lines.

Figure 5:
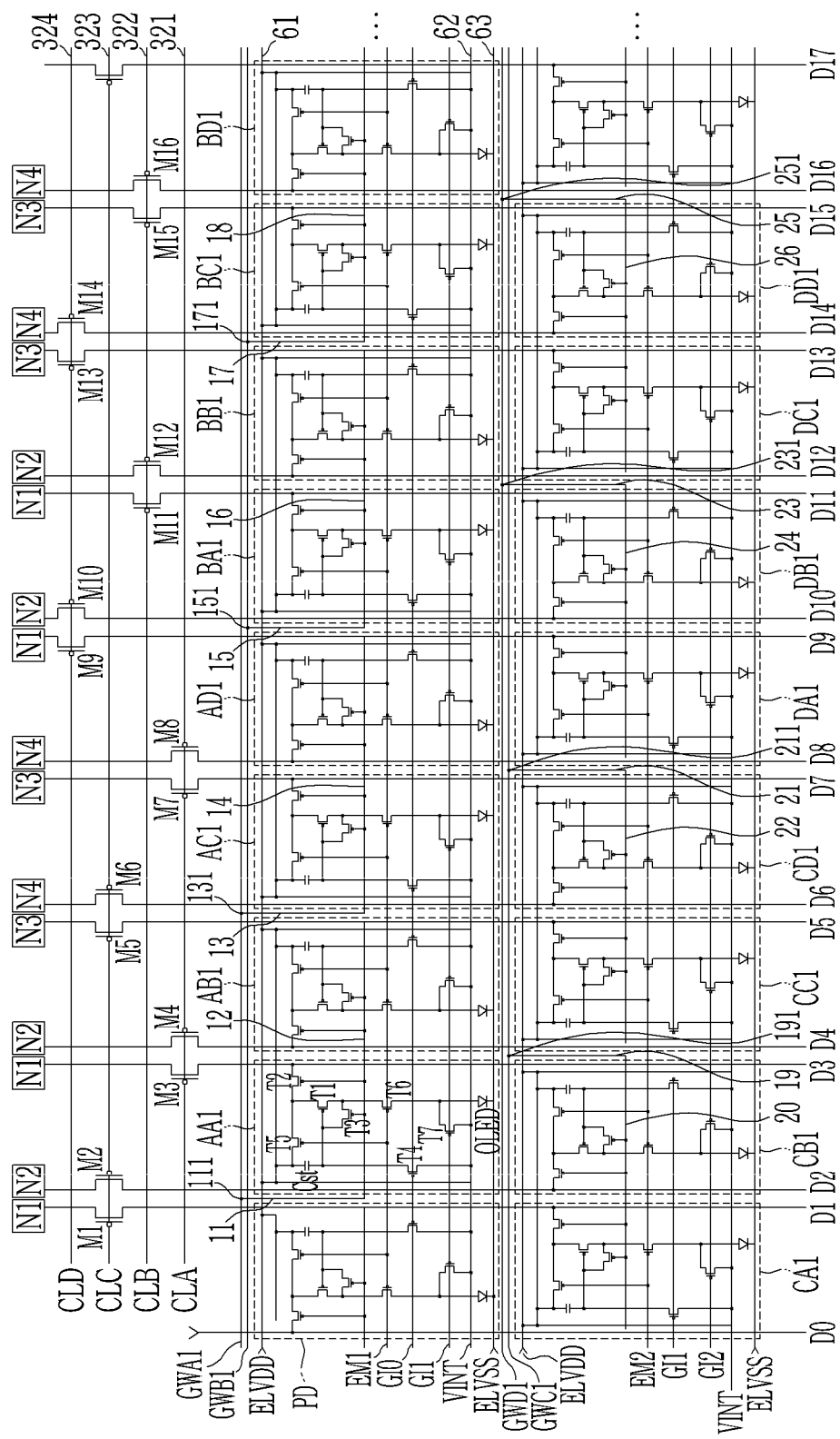
FIG. 5 illustrates a plurality of pixels, a plurality of scan gate lines, a plurality of initialization lines, and a plurality of data lines and voltage lines for driving the pixels in a display device according to some embodiments.

Hereinafter, a display device and a driving method according to some embodiments will be described with reference to FIG. 5 and FIG. 6. In FIG. 5, a gate bridge for transferring scan signals corresponding to each pixel through the aforementioned scan gate lines is illustrated.

FIG. 5 illustrates a plurality of pixels, a plurality of scan gate lines, a plurality of initialization lines, and a plurality of data lines and voltage lines for driving the pixels in a display device according to some embodiments.

Figure 6:
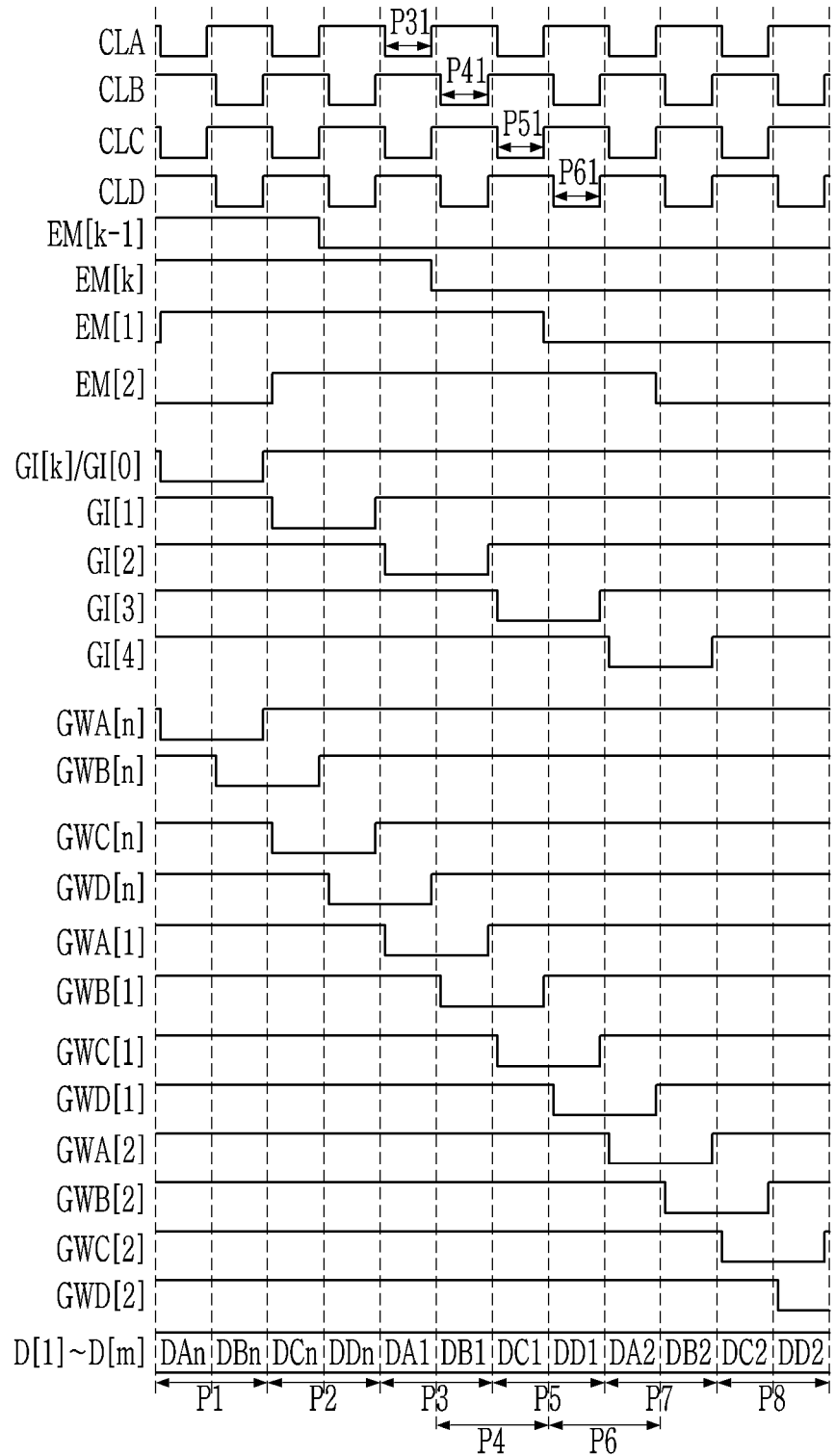
FIG. 6 is a waveform diagram illustrating a plurality of scan signals, a plurality of initialization signals, a plurality of emission control signals, a plurality of demultiplexing control signals, and a plurality of data signals for driving a display device according to some embodiments.

FIG. 6 is a waveform diagram illustrating a plurality of scan signals, a plurality of initialization signals, a plurality of emission control signals, a plurality of demultiplexing control signals, and a plurality of data signals for driving a display device according to some embodiments.

In FIG. 5, nine pixels in the first and second pixel rows are illustrated among the plurality of pixels. Two power supply lines 61 and 63 and an initialization line 62 are illustrated, which are to be connected to the dummy pixel PD connected to the dummy data line D0. However, it should be appreciated that this is just an example, and the present invention is not limited thereto or thereby. For example, a connection between the dummy pixel PD and another element may be changed depending on the design, or the dummy pixel PD may not be formed in the display unit 10 (e.g., the dummy pixel PD in some embodiments may be omitted).

In FIG. 5, two gate bridges are connected with each of a plurality of scan gate lines GWA1, GWB1, GWC1, and GWD1, and each gate bridge may include two gate bridge electrodes.

For example, the two gate bridges connected with the scan gate line GWA1 may include a first gate bridge for supplying a scan signal GWA[1] to two pixels AA1 and AB1, and a second gate bridge for supplying the scan signal GWA[1] to two pixels AC1 and AD1. The first gate bridge may include two gate bridge electrodes 11 and 12, and the second gate bridge may include two gate bridge electrodes 13 and 14.

A first end of the gate bridge electrode 11 is connected with a node 111, and the gate bridge electrode 11 extends from a left side of the two pixels AA1 and AB1 in a first direction y. A first end of the gate bridge electrode 12 is connected with a second end of the gate bridge electrode 11, and the gate bridge electrode 12 extends in a second direction x over a region where the two pixels AA1 and AB1 are formed. The node 111 may be positioned between two data lines D1 and D2 in the scan gate line GWA1, but the present invention is not limited thereto or thereby.

A first end of the gate bridge electrode 13 is connected with a node 131, and the gate bridge electrode 13 extends from a left side of the two pixels AC1 and AD1 in the first direction y. A first end of the gate bridge electrode 14 is connected with a second end of the gate bridge electrode 13, and the gate bridge electrode 14 extends in the second direction x over a region where the two pixels AC1 and AD1 are formed. The node 131 may be positioned between two data lines D5 and D6 in the scan gate line GWB1, but the present invention is not limited thereto or thereby.

In addition, the two gate bridges connected with the scan gate line GWB1 may include a first gate bridge for supplying a scan signal GWB[1] to two pixels BA1 and BB1, and a second gate bridge for supplying the scan signal GWB[1] to two pixels BC1 and BD1. The first gate bridge may include two gate bridge electrodes 15 and 16, and the second gate bridge may include two gate bridge electrodes 17 and 18.

A first end of the gate bridge electrode 15 is connected with a node 151, and the gate bridge electrode 15 extends from a left side of the pixel BA1 and BB1 in the first direction y. A first end of the gate bridge electrode 16 is connected with a second end of the gate bridge electrode 15, and the gate bridge electrode 16 extends in the second direction x over a region where the two pixels BA1 and BB1 are formed. The node 151 may be positioned between two data lines D9 and D10 in the scan gate line GWB1, but the present invention is not limited thereto or thereby.

A first end of the gate bridge electrode 17 is connected with a node 171, and the gate bridge electrode 17 extends from a left side of the two pixels BC1 and BD1. A first end of the gate bridge electrode 18 is connected with a second end of the gate bridge electrode 17, and the gate bridge electrode 18 extends in the second direction x over a region where the two pixels BC1 and BD1 are formed. The node 171 may be positioned between two data lines D13 and D14 in the scan gate line GWB1, but the present invention is not limited thereto or thereby.

For example, the two gate bridges connected with the scan gate line GWC1 may include a first gate bridge for supplying a scan signal GWC[1] to two pixels CA1 and CB1, and a second gate bridge for supplying the scan gate line GWC1 to two pixels CC1 and CD1. The first gate bridge may include two gate bridge electrodes 19 and 20, and the second gate bridge may include two gate bridge electrodes 21 and 22.

A first end of the gate bridge electrode 19 is connected with a node 191, and the gate bridge electrode 19 extends from a right side of the two pixels CA1 and CB1 in the first direction y. A first end of the gate bridge electrode 20 is connected with a second end of the gate bridge electrode 19, and the gate bridge electrode 20 extends in the second direction x over a region where the two pixels CA1 and CB1 are formed. The node 191 may be positioned between two data lines D3 and D4 in the scan gate line GWC1, but the present invention is not limited thereto or thereby.

A first end of the gate bridge electrode 21 is connected with a node 211, and the gate bridge electrode 21 extends from a right side of the two pixels CC1 and CD1. A first end of the gate bridge electrode 22 is connected with a second end of the gate bridge electrode 21, and the gate bridge electrode 22 extends in the second direction x over a region where the two pixels CC1 and CD1 are formed. The node 211 may be positioned between two data lines D7 and D8 in the scan gate line GWC1, but the present invention is not limited thereto or thereby.

The two gate bridges connected with the scan gate line GWD1 may include a first gate bridge for supplying a scan signal GWD[1] to two pixels DA1 and DB1, and a second gate bridge for supplying the scan signal GWD[1] to the scan gate line GWD1. The first gate bridge may include two gate bridge electrodes 23 and 24, and the second gate bridge may include two gate bridge electrodes 25 and 26.

A first end of the gate bridge electrode 23 is connected with a node 231, and the gate bridge electrode 23 extends from a right side of the two pixels DA1 and DB1 in the first direction y. A first end of the gate bridge electrode 24 is connected with a second end of the gate bridge electrode 23, and the gate bridge electrode 24 extends in the second direction x over a region where the two pixels DA1 and DB1 are formed. The node 231 may be positioned between two data lines D11 and D12 in the scan gate line GWD1, but the present invention is not limited thereto or thereby.

A first end of the gate bridge electrode 25 is connected with a node 251, and the gate bridge electrode 25 extends from a left side of the two pixels in the first direction y. A first end of the gate bridge electrode 26 is connected with a second end of the gate bridge electrode 25, and the gate bridge electrode 26 extends in the second direction x over a region where the two pixels DC1 and DD1 are formed. The node 251 may be positioned between two data lines D15 and D16 in the scan gate line GWD1, but the present invention is not limited thereto or thereby.

It is illustrated in FIG. 5 that the gate bridge electrodes (hereinafter referred to as first gate bridge electrodes), e.g., first gate bridge electrodes 11, 13, 15, and 17 extending in the first direction y from the A pixel group and the B pixel group, are positioned at a left side of the corresponding pixel, and the first gate bridge electrodes 19, 21, 23, and 25 are positioned at a right side of the corresponding pixel, but the present invention is not limited thereto or thereby.

The first gate bridge electrodes may be positioned at a left or right side of the corresponding pixel from the A pixel group, the B pixel group, the C pixel group, and the D pixel group. Alternatively, the first gate bridge electrodes may be positioned at a left (or right) side of the corresponding pixel from the A pixel group and the C pixel group, may be positioned at a right (or left) side of the corresponding pixel from the B pixel group and the D pixel group, and vice versa.

In addition, a number of the pixels illustrated in FIG. 5 corresponding to each of the gate bridge electrodes (hereinafter referred to as second gate bridge electrodes), e.g., second gate bridge electrodes 12, 14, 16, 18, 20, 22, 24 and 26, but the present invention is not limited thereto or thereby.

The second gate bridge electrodes may extend over all pixels in a pixel group. In some embodiments, only one first gate bridge electrode may be positioned in the pixel group.

A plurality of nodes N1-N4 illustrated in FIG. 5 indicate nodes connected with output terminals of four amplifiers SA1-SA4 of the source driver 30. Because pixel circuits constituting the respective pixels of the display unit 10 are the same, a pixel circuit of one pixel AA1 will be described as an example of the pixel circuits.

The pixel AA1 includes an organic light emitting diode OLED, seven transistors T1-T7, and one capacitor Cst. It should be appreciated that the pixel circuit illustrated in FIG. 5 is merely an example, and the present invention is not limited thereto or thereby.

The transistor T2 includes a first electrode connected with a corresponding data line D3 and a second electrode connected with a source electrode of the driving transistor T1. A gate electrode of the driving transistor T1 is connected with a first electrode of the capacitor Cst, a first electrode of the transistor T4, and a first electrode of the transistor T3, A drain electrode of the driving transistor T1 is connected with a first electrode of the transistor T6 and a second electrode of the transistor T3. A first electrode of the transistor T5 is connected with a source electrode of the driving transistor T1, and a second electrode of the transistor T5 is connected with a power supply line 61. A second electrode of the transistor T6 is connected with a first electrode of the transistor T7 and an anode of the organic light emitting diode OLED. A second electrode of the transistor T4 and a second electrode of the transistor T7 are connected with an initialization line 62, and a cathode of the organic light emitting diode OLED is connected with a power supply line 63. The emission control signal EM1 may serve as a gate electrode of the transistor T5 and a gate electrode of the transistor T6. In addition, the gate bridge electrode 12 may serve as gate electrodes of the transistors T2 and T3, the initialization line GI0 may serve as a gate electrode of the transistor T4, and the initialization line GI1 may serve as a gate electrode of the transistor T7.

The other pixels illustrated in FIG. 5 include a similar layout of transistors T1-T7 and a capacitor as pixel AA1, however some of the layouts are flipped relative to pixel AA1 (e.g., pixel AB1). A first electrode of a transistor T2 of the pixel AB1 is connected with the data line D4. In addition, a first electrode of a transistor T2 of the pixel AC1 may be connected with the data line D7, a first electrode of a transistor T2 of the pixel AD1 is connected with the data line D8, and the gate bridge electrode 14 may serve as gate electrodes of the transistors T2 and T3 in the pixels AC1 and AD1.

A first electrode of a transistor T2 of the pixel BA1 is connected with the data line D11, a first electrode of a transistor T2 of the pixel BB1 is connected with the data line D12, and the gate bridge electrode 16 may serve as gate electrodes of the transistors T2 and T3 in the pixels BA1 and BB1. In addition, a first electrode of a transistor T2 of the pixel BC1 is connected with the data line D15, a first electrode of a transistor T2 of the pixel BD1 is connected with the data line D16, and the gate bridge electrode 18 may serve as gate electrodes of the transistors T2 and T3 in the pixels BC1 and BD1.

A first electrode of a transistor T2 of the pixel CA1 is connected with the data line D1, and a first electrode of a transistor T2 of the pixel CB1 is connected with the data line D2. The gate bridge electrode 20 may serve as gate electrodes of the transistors T2 and T3 in the pixels CA1 and CB1.

A first electrode of a transistor T2 of the pixel CC1 is connected with the data line D5, and a first electrode of a transistor T2 of the pixel CD1 is connected with the data line D6. The gate bridge electrode 22 may serve as gate electrodes of the transistor T2 and T3 in the pixels CC1 and CD1.

A first electrode of a transistor T2 of the pixel DA1 is connected with the data line D9, and a first electrode of a transistor T2 of the pixel DB1 is connected with the data line D10. The gate bridge electrode 24 may serve as gate electrodes of the transistor T2 and T3 in the pixels DA1 and DB1.

A first electrode of a transistor T2 of the pixel DC1 is connected with the data line D13, and a first electrode of a transistor T2 of the pixel DD1 is connected with the data line D14. The gate bridge electrode 26 may serve as the gate electrodes of the transistors T2 and T3 in the pixels DC1 and DD1.

The emission control signal EM2 may serve as gate electrodes of the transistors T5 and T6, the initialization line GI1 may serve as a gate electrode of the transistor T5, and the initialization line GI2 may serve as a gate electrode of the transistor T7 in the pixels CA1, CB1, CC1, CD1, DA1, DB1, DC1, and DD1 of a second pixel row.

Hereinafter, operation of the display device according to some embodiments will be described with reference to FIG. 6.

During a period P1, the initialization signal GI[0] is in a low level, so that transistors T4 of all pixels of the first pixel row are turned on. Then, a gate voltage of the driving transistor T1 is initialized by the initialization voltage VINT.

During a period P2, the initialization signal GI[1] is in a low level, so that transistors T7 of all pixels of the first pixel row are turned on. Then, anode voltages of all organic light emitting diodes OLED of the first pixel row are initialized by the initialization voltage VINT. Transistors T4 of all pixels of the second pixel row are turned on to initialize a gate voltage of the driving transistor T1. During a period P3, the initialization signal GI[2] is in a low level, so that transistors T7 of all pixels of the second pixel row are turned on. Then, anode voltages of all organic light emitting diodes OLED of the second pixel row are initialized by the initialization voltage VINT.

During a period P31, when the demultiplexing control signal CLA is in a low level, the plurality of transistors M3, M4, M7, and M8 are turned on so that a plurality of data voltages DA1 may be transferred to the plurality of pixels AA1, AB1, AC1, and AD1 through the plurality of data lines D3, D4, D7, and D8. During the period P3, the scan signal GWA[1] is in a low level, and thus transistors T2 and T3 of the plurality of pixels AA1, AB1, AC1, and AD1 are turned on. Then, driving transistors T1 of the pixels AA1, AB1, AC1, and AD1 are diode-connected, and gate voltages of the driving transistors T1 become a voltage obtained by compensating the data voltage by a threshold voltage of the driving transistor T1.

During the period P31, since the demultiplexing control signal CLC is in a low level, but the scan signal GWC[1] is in a high level, transistors T2 of the plurality of pixels CA1, CB1, CC1, and CD1 are turned off. Then, the pixels CA1, CB1, CC1, and CD1 are not electrically connected to corresponding data lines, and thus data voltages are not transferred.

During a period P41, when the multiplexing control signal CLB is in a low level, the plurality of transistors M11, M12, M15, M16 may be turned on to transfer a plurality of data voltages DB1 to the plurality of pixels BA1, BB1, BC1, and BD1 through the plurality of data lines D11, D12, D15, and D16. During a period P4, since the scan signal GWB[1] is in a low level, transistors T2 and T3 of the plurality of pixels BA1, BB1, BC1, and BD1 are turned on. Then, driving transistors T1 of the pixels BA1, BB1, BC1, and BD1 are diode-connected, and gate voltages of the driving transistors T1 become a voltage obtained by compensating the data voltage by a threshold voltage of the driving transistor T1. Since the emission control signal EM[1] is in a low level at an end of the period P4, transistors T5 and T6 are turned on to supply the power voltage ELVDD to source electrodes of the driving transistors T1, and driving currents of the driving transistors T1 are supplied to the organic light emitting diodes OLED. Then, all of the organic light emitting diodes OLED of the first pixel row emit light depending on the driving currents.

During the period P41, since the demultiplexing control signal CLD is in a low level, but the scan signal GWD[1] is in a high level, transistors T2 of the plurality of pixels DA1, DB1, DC1, and DD1 are turned off. Then, the pixels DA1, DB1, DC1, and DD1 are not electrically connected to corresponding data lines, and thus data voltages are not transferred.

During a period P51, when the demultiplexing control signal CLC is in a low level, the plurality of transistors M1, M2, M5, and M6 turned on, and a plurality of data voltages DC1 are transferred to the plurality of pixels CA1, CB1, CC1, and CD1 through the plurality of data lines D1, D2, D5, and D6. During a period P5, since the scan signal GWC[1] is in a low level, transistors T2 and T3 of the plurality of pixels CA1, CB1, CC1, and CD1 are turned on. Then, driving transistors T1 of the pixels CA1, CB1, CC1, and CD1 are diode-connected, and gate voltages of the driving transistors T1 become a voltage obtained by compensating the data voltage by a threshold voltage of the driving transistor T1.

During a period P61, when the demultiplexing control signal CLD is in a low level, the plurality of transistors M9, M10, M13, and M14 are turned on, a plurality of data voltages DD1 are transferred to the plurality of pixels DA1, DB1, DC1, DD1 through the plurality of data lines D9, D10, D13, and D14. During a period P6, since the scan signal GWD[1] is in a low level, transistors T2 and T3 of the pixels DA1, DB1, DC1, and DD1 are turned on. Then, driving transistors T1 of the pixels DA1, DB1, DC1, and DD1 are diode-connected, and gate voltages of the driving transistors T1 become a voltage obtained by compensating the data voltage by a threshold voltage of the driving transistor T1. Since the emission control signal EM[2] is in a low level at an end of the period P6, transistors T5 and T6 are turned on to supply the power voltage ELVDD to source electrodes of the driving transistors T1, and driving currents of the driving transistors T1 are supplied to the organic light emitting diode OLED. Then, all of the organic light emitting diodes OLED of the second pixel row emit light depending on driving currents.

In addition, the scan signal GWA[n] is in a low level during the period P1, and a plurality of data voltages DAn are written in a plurality of A pixel groups of $(k+1)^{th}$ pixel rows during a period (e.g., portion) of the period P1 during which the demultiplexing control signal CLA is in a low level. Moreover, a plurality of data voltages DBn are written in a plurality of B pixel groups of $(k-1)^{th}$ pixel rows during a period of the period P1 during which the demultiplexing control signal CLB is in a low level. Then, when an emission control signal EM[k-1] is in a low level, all pixels of $(k-1)^{th}$ pixel rows emit light.

The scan signal GWC[n] is in a low level during the period P2, and a plurality of data voltages DCn are written in a plurality of C pixel groups of kth pixel rows during a period of the period P2 during which the demultiplexing control signal CLC is in a low level. In addition, a plurality of data voltages DDn are written in a plurality of D pixel groups of kth pixel rows during a period of the period P2 during which the demultiplexing control signal CLD is in a low level. Then, when an emission control signal EM[k] is in a low level, all pixels of kth pixel rows emit light.

During the period P3, the initialization signal GI[2] is in a low level, and thus transistors T4 of all pixels of the third pixel row are turned on. Then, gate voltages of all driving transistors T1 of the third pixel row are initialized by the initialization voltage VINT.

During the period P5, the initialization signal GI[3] is in a low level, and thus transistors T7 of all pixels of the third pixel row are turned on. Then, anode voltages of all organic light emitting diodes OLED of the third pixel row are initialized by the initialization voltage VINT. Transistors T4 of all pixels of the fourth pixel row are turned on, and thus gate voltages of all driving transistors T1 of the fourth pixel row are initialized.

During the period P7, the initialization signal GI[4] is in a low level, and thus transistors T7 of all pixels of the fourth pixel row are turned on. Then, anode voltages of all organic light emitting diodes OLED of the fourth pixel row are initialized by the initialization voltage VINT.

The scan signal GWA[2] is in a low level during the period P7, and a plurality of data voltages DA2 are written in a plurality of A pixel groups of the third pixel row during a period during which the demultiplexing control signal CLA is in a low level. In addition, a plurality of data voltages DB2 are written in a plurality of B pixel groups of the third pixel row during a period of the period P7 during which the demultiplexing control signal CLB is in a low level. Then, when the emission control signal EM[3] is in a low level, all pixels of the third pixel row emit light.

The scan signal GWC[n] is in a low level during the period P8, and a plurality of data voltages DC2 are written in a plurality of C pixel groups of the fourth pixel row during a period of the period P8 during which the demultiplexing control signal CLC is in a low level. In addition, a plurality of data voltages DD2 are written in a plurality of D pixel groups of the fourth pixel row during a period of the period P8 during which the demultiplexing control signal CLD is in a low level. Then, when the emission control signal EM[4] is in a low level, all pixels of kth pixel rows emit light.

In this way, an initialization operation, an operation of compensating the threshold voltage/writing data, and an emission operation may be performed in a unit of a pixel row of the display unit 10.

In some embodiments, the data lines D3, D4, D7, and D8 are in a floating state instead of being connected to an amplifier during periods other than the period P31 of the period P3. In some embodiments, when the data lines D11, D12, D15, and D16 are connected with the amplifier to supply data voltages, a change in the voltage of the data lines D11, D12, D15, and D16 does not affect voltages written in the data lines D3, D4, D7, and D8, which are in the floating state. This is because, since parasitic capacitance occurring between the data lines D11, D12, D15, and D16 and the data lines D3, D4, D7, and D8 is very small, coupling between the data lines data lines D11, D12, D15, and D16 and the data lines D3, D4, D7, and D8 does not substantially occur. Specifically, although a distance between the data line D8 and the data line D11 is closest, even in this case, the parasitic capacitance therebetween is negligible.

According to some embodiments, the A pixel group, the B pixel group, the C pixel group, and the D pixel group are disposed in a zigzag pattern, and two data lines corresponding to two adjacent pixels are disposed between the two pixels. Accordingly, although data is completely written in the plurality of pixel groups corresponding to a first one of two scan gate lines in a pixel row, and then the data writing operation is performed in a plurality of pixel groups corresponding to a second one of the scan gate lines, coupling caused by parasitic capacitance does not occur.

The demultiplexing control signals CLA, CLB, CLC, and CLD are not limited to waveforms illustrated in FIG. 6. For example, their periods may be doubled, and their duty cycle may be reduced by half as compared with the waveforms illustrated in FIG. 6. For example, one period of the demultiplexing control signals CLA, CLB, CLC, and CLD may be a period P3+P5, and may be in a low level only during periods P31, P41, P51, and P61.

Figure 7:
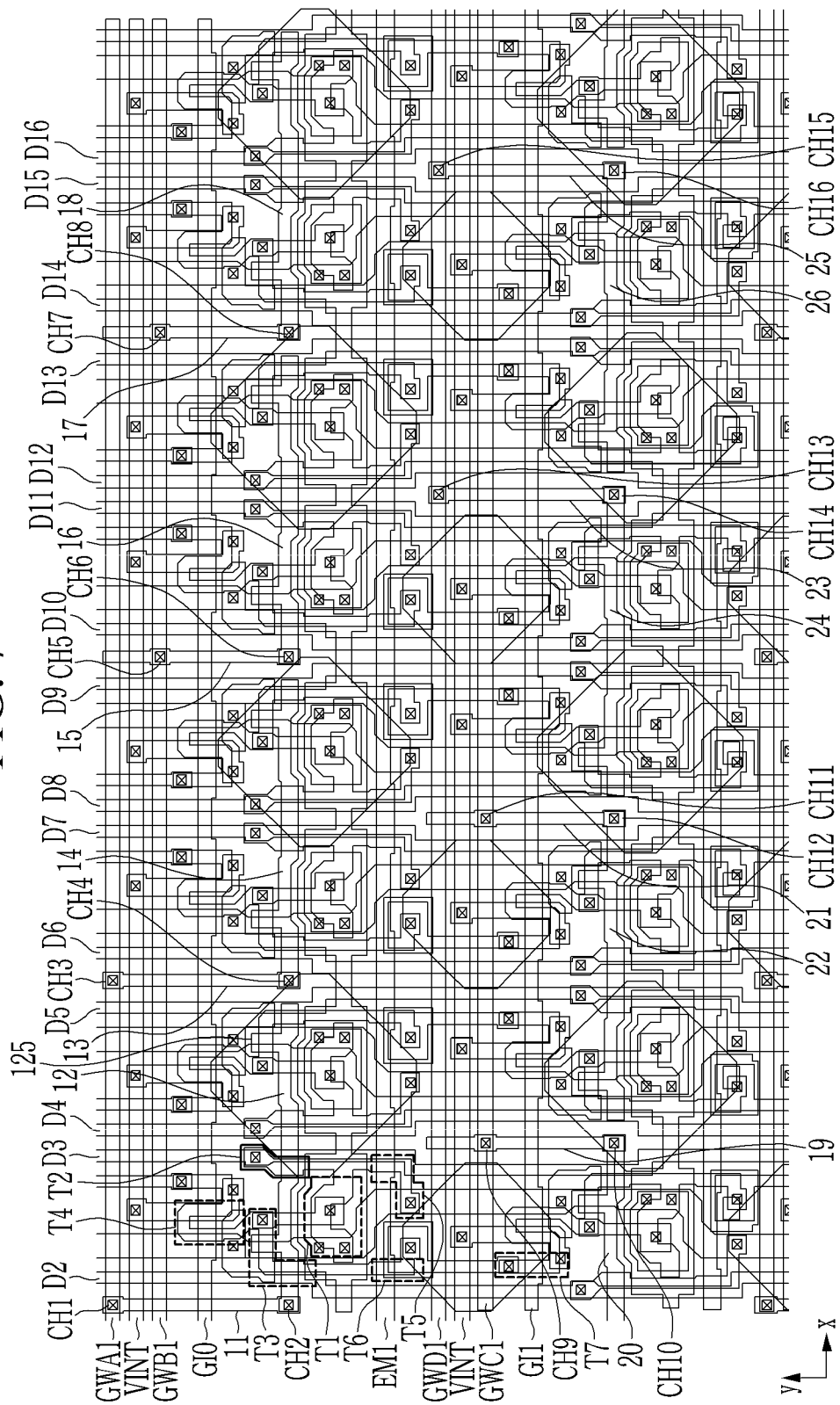
FIG. 7 is a top plan view illustrating a layout of the pixels illustrated in FIG. 5.

FIG. 7 is a top plan view illustrating a layout of the pixels illustrated in FIG. 5.

In FIG. 7, the same constituent elements as those illustrated in FIG. 5 are denoted by the same reference numerals.

As shown in FIG. 7, a first end of the first gate bridge electrode 11 is connected with the scan gate line GWA1 through a contact hole CH1, and a second end of the first gate bridge electrode 11 is connected with a first end of the second gate bridge electrode 12 through a contact hole CH2.

The second gate bridge electrode 12 is a gate electrode that is disposed across semiconductor layers of the transistors T2 and T3 of two pixels AA1 and AB1. The second gate bridge electrode 12 may include a first electrode 125 that extends in a direction y crossing an extending direction x of the second gate bridge electrode, and the first electrode 125 may be one of double gate electrodes of the transistor T3. The above description may be applied to all second gate bridge electrodes of the display unit 10 according to some embodiments.

A first end of the first gate bridge electrode 13 is connected with the scan gate line GWA1 through a contact hole CH3, and a second end of the first gate bridge electrode 13 is connected with a first end of the second gate bridge electrode 14 through a contact hole CH4. A first end of the first gate bridge electrode 15 is connected with the scan gate line GWB1 through a contact hole CH5, and a second end of the first gate bridge electrode 15 is connected with a first end of the second gate bridge electrode 16 through a contact hole CH6. A first end of the first gate bridge electrode 17 is connected with the scan gate line GWB1 through a contact hole CH7, and a second end of the first gate bridge electrode 17 is connected with a first end of the second gate bridge electrode 18 through a contact hole CH8.

A first end of the first gate bridge electrode 19 is connected with the scan gate line GWC through a contact hole CH10, and a second end of the first gate bridge electrode 19 is connected with a first end of the second gate bridge electrode 20 through a contact hole CH10. A first end of the first gate bridge electrode 21 is connected with the scan gate line GWC1 through a contact hole CH11, and a second end of the first gate bridge electrode 21 is connected with a first end of the second gate bridge electrode 22 through a contact hole CH12. A first end of the first gate bridge electrode 23 is connected with the scan gate line GWD1 through a contact hole CH13, and a second end of the first gate bridge electrode 23 is connected with a first end of the second gate bridge electrode 24 through a contact hole CH14. A first end of the first gate bridge electrode 25 is connected with the scan gate line GWD1 through a contact hole CH15, and a second end of the first gate bridge electrode 25 is connected with a first end of the second gate bridge electrode 26 through a contact hole CH16.

A structure of the gate bridge and a connection structure between corresponding scan gate lines may be variously modified. Hereinafter, some embodiments will be described with reference to FIG. 8 to FIG. 10.

Figure 8:
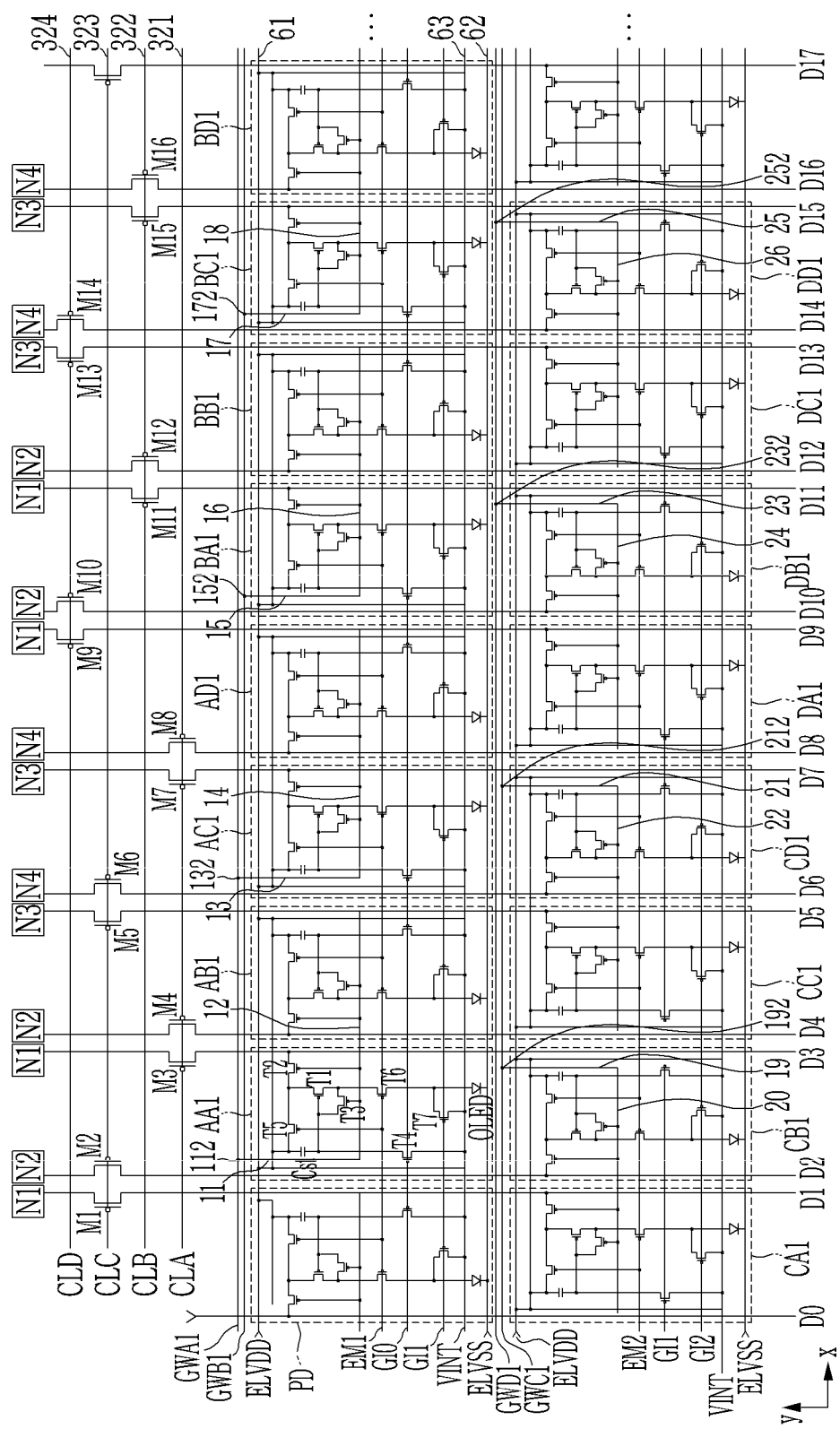
FIG. 8 illustrates a plurality of pixels, a plurality of scan gate lines, a plurality of initialization lines, and a plurality of data lines and voltage lines for driving the pixels in a display device according to some embodiments.

FIG. 8 illustrates a plurality of pixels, a plurality of scan gate lines, a plurality of initialization lines, and a plurality of data lines and voltage lines for driving the pixels in a display device according to some embodiments.

Identical to FIG. 5, nine pixels of first and second pixel rows among a plurality of pixels are illustrated in FIG. 8. In FIG. 8, the same constituent elements as those of the example embodiment of FIG. 5 are denoted by the same reference numerals. Hereinafter, the differences of the embodiment of FIG. 8 from the example embodiment of FIG. 5 will be described.

As shown in FIG. 8, in the display unit 10 according to some embodiments, a position of a node 112 to which the first gate bridge electrode 11 and the scan gate line GWA1 are connected is different from that of the example embodiment of FIG. 5. The node 112 may be positioned in a pixel area corresponding to one pixel AA1 among two corresponding pixels to reduce capacitance between a gate bridge and a data line.

For example, a position in the first direction y of the node 112 connected with the scan gate line GWA1 corresponding to the first gate bridge electrode 11 may be determined depending on a position of the corresponding scan gate line GWA1. In addition, a position in the second direction x may be determined as a portion between the data line D2 closest to one side (a left side in FIG. 8) of two pixels AA1 and AB1 and the transistor T3 of the pixel AA1 positioned at a side of the two corresponding pixels. Unlike in the example embodiment of FIG. 5 in which the node 111 is positioned between the data line D1 and the data line D2 in the scan gate line GWA1, the node 112 according to the embodiment of FIG. 8 is positioned between the data line D2 and the transistor T3 of the pixel AA1 in the scan gate line GWA1.

A node 132 is positioned between the data line D6 and the transistor T3 of the pixel AC1 in the scan gate line GWA1. A node 152 is positioned between the data line D10 and the transistor T3 of the pixel BA1 in the scan gate line GWB1. A node 172 is positioned between the data line D14 and the transistor T3 of the pixel BC1 in the scan gate line GWB1. A node 192 is positioned between the data line D3 and the transistor T3 of the pixel CB1 in the scan gate line GWC1. A node 212 is positioned between the data line D7 and the transistor T3 of the pixel CD1 in the scan gate line GWC1. A node 232 is positioned between the data line D11 and the transistor T3 of the pixel DB1 in the scan gate line GWD1. A node 252 is positioned between the data line D15 and the transistor T3 of the pixel BD1 in the scan gate line GWD1.

Figure 9:
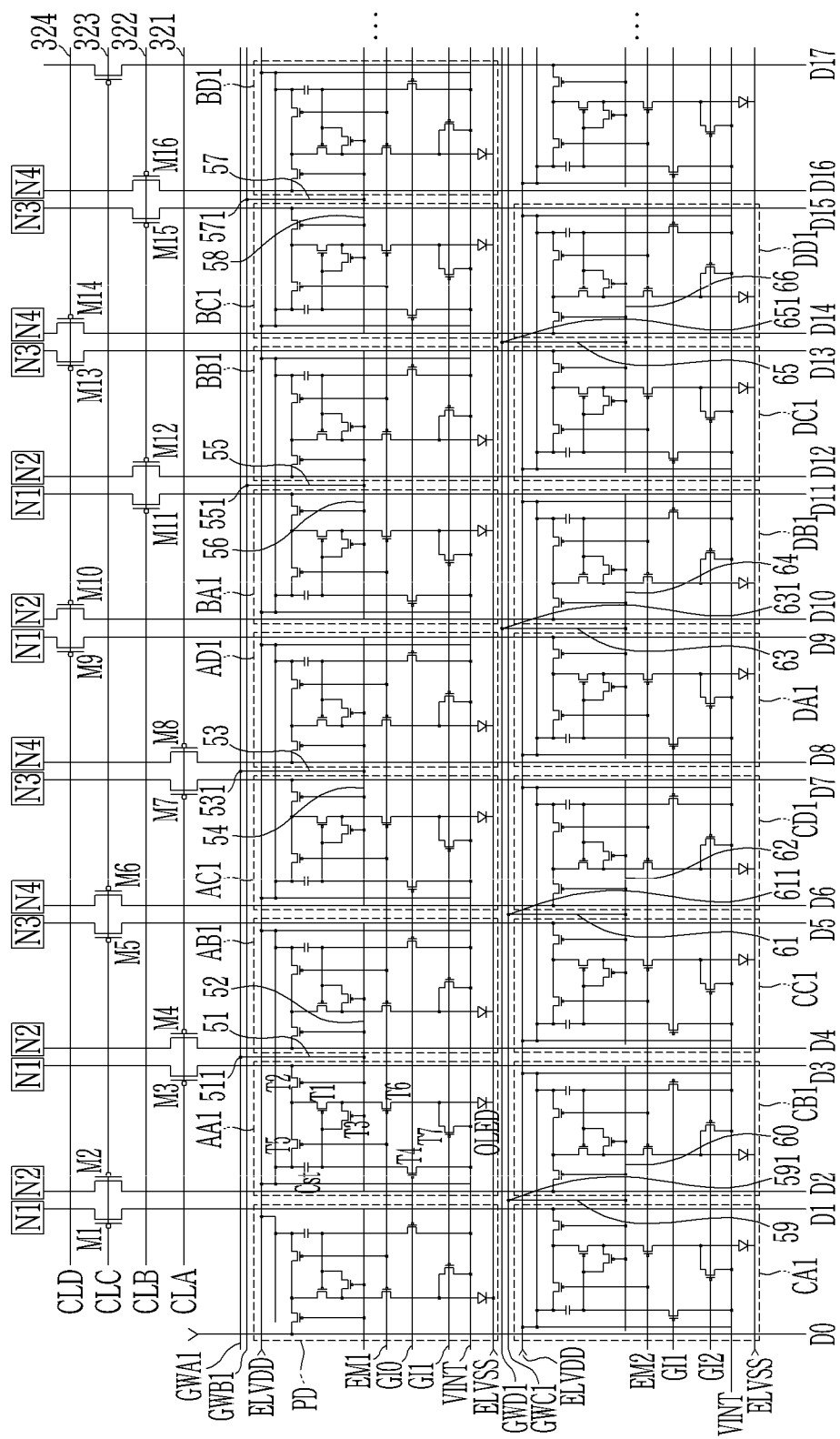
FIG. 9 illustrates a plurality of pixels, a plurality of scan gate lines, a plurality of initialization lines, and a plurality of data lines and voltage lines for driving the pixels in a display device according to some embodiments.

FIG. 9 illustrates a plurality of pixels, a plurality of scan gate lines, a plurality of initialization lines, and a plurality of data lines and voltage lines for driving the pixels in a display device according to some embodiments.

Identical to FIG. 5, nine pixels of first and second pixel rows among a plurality of pixels are illustrated in FIG. 9. In FIG. 9, the same constituent elements as those of the example embodiment illustrated in FIG. 5 are denoted by the same reference numerals. Hereinafter, the differences of the embodiment of FIG. 9 from the example embodiment of FIG. 5 will be described.

As shown in FIG. 9, the gate bridge has an inverted T shape in the display unit 10 according to some embodiments.

A node 511 where a first gate bridge electrode 51 and the scan gate line GWA1 are connected with each other between two data lines D3 and D4 is positioned between two corresponding pixels AA1 and AB1. A second gate bridge electrode 52 is positioned across the two pixels AA1 and AB1 which correspond to each other based on the first gate bridge electrode 51. In addition, the first gate bridge electrode 51 and the second gate bridge electrode 52 are connected with each other at an intermediate point of the second gate bridge electrode 52.

A node 531 where a first gate bridge electrode 53 and the scan gate line GWA1 are connected with each other between two data lines D7 and D8 is positioned between two corresponding pixels AC1 and AD1. A second gate bridge electrode 54 is positioned across the two pixels AC1 and AD1 which correspond to each other based on the first gate bridge electrode 53. In addition, the first gate bridge electrode 53 and the second gate bridge electrode 54 are connected with each other at an intermediate point of the second gate bridge electrode 54.

A node 551 where a first gate bridge electrode 55 and the scan gate line GWB1 are connected with each other between two data lines D11 and D12 is positioned between two corresponding pixels BA1 and BB1. A second gate bridge electrode 56 is positioned across the two pixels BA1 and BB1 which correspond to each other based on the first gate bridge electrode 55. In addition, the first gate bridge electrode 55 and the second gate bridge electrode 56 are connected with each other at an intermediate point of the second gate bridge electrode 56.

A node 571 where a first gate bridge electrode 57 and the scan gate line GWB1 are connected with each other between two data lines D15 and D16 is positioned between two corresponding pixels BC1 and BD1. A second gate bridge electrode 58 is positioned across the two pixels BC1 and BD1 which correspond to each other based on the first gate bridge electrode 57. In addition, the first gate bridge electrode 57 and the second gate bridge electrode 58 are connected with each other at an intermediate point of the second gate bridge electrode 58.

A node 591 where a first gate bridge electrode 59 and the scan gate line GWC1 are connected with each other between two data lines D1 and D2 is positioned between two corresponding pixels CA1 and CB1. A second gate bridge electrode 60 is positioned across the two pixels CA1 and CB1 which correspond to each other based on the first gate bridge electrode 59. In addition, the first gate bridge electrode 59 and the second gate bridge electrode 60 are connected with each other at an intermediate point of the second gate bridge electrode 60.

A node 611 where a first gate bridge electrode 61 and the scan gate line GWC1 are connected with each other between two data lines D5 and D6 is positioned between two corresponding pixels CC1 and CD1. A second gate bridge electrode 62 is positioned across the two pixels CC1 and CD1 which correspond to each other based on the first gate bridge electrode 61. In addition, the first gate bridge electrode 61 and the second gate bridge electrode 62 are connected with each other at an intermediate point of the second gate bridge electrode 62.

A node 631 where a first gate bridge electrode 63 and the scan gate line GWD1 are connected with each other between two data lines D9 and D10 is positioned between two corresponding pixels DA1 and DB1. A second gate bridge electrode 64 is positioned across the two pixels DA1 and DB1 which correspond to each other based on the first gate bridge electrode 63. In addition, the first gate bridge electrode 63 and the second gate bridge electrode 64 are connected with each other at an intermediate point of the second gate bridge electrode 63.

A node 651 where a first gate bridge electrode 65 and the scan gate line GWD1 are connected with each other between two data lines D13 and D14 is positioned between two corresponding pixels DC1 and DD1. A second gate bridge electrode 66 is positioned across the two pixels DC1 and DD1 which correspond to each other based on the first gate bridge electrode 65. In addition, the first gate bridge electrode 65 and the second gate bridge electrode 66 are connected with each other at an intermediate point of the second gate bridge electrode 66.

Figure 10:
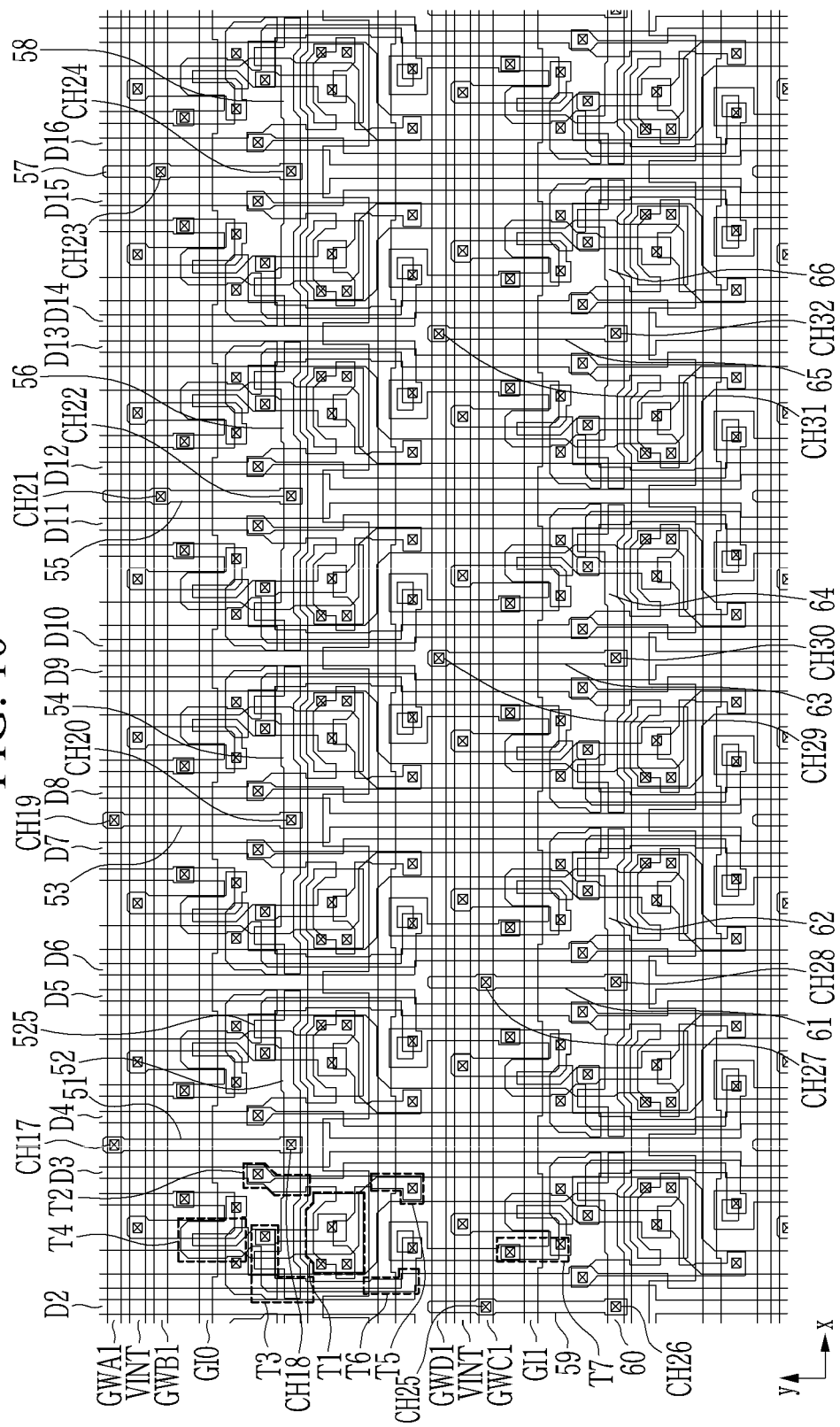
FIG. 10 is a top plan view illustrating a layout of the pixels illustrated in FIG. 9.

FIG. 10 is a top plan view illustrating a layout of the pixels illustrated in FIG. 9.

In FIG. 10, the same constituent elements as those illustrated in FIG. 9 are denoted by the same reference numerals.

As shown in FIG. 10, a first end of the first gate bridge electrode 51 is connected with the scan gate line GWA1 through a contact hole CH17, and a second end of the first gate bridge electrode 51 is connected with the second gate bridge electrode 52 through a contact hole CH18 at an intermediate point of the second gate bridge electrode 52.

The second gate bridge electrode 52 is a gate electrode that is positioned across semiconductor layers of the transistors T2 and T3 of two pixels AA1 and AB1, based on the first gate bridge electrode 51. The second gate bridge electrode 52 may include a first electrode 525 that extends in a direction y crossing an extending direction x of the second gate bridge electrode, and the first electrode 525 may be one of double gate electrodes of the transistor T3. The above description may be applied to all second gate bridge electrodes of the display unit 10 according to some embodiments.

A first end of the first gate bridge electrode 53 is connected with the scan gate line GWA1 through a contact hole CH19, and a second end of the first gate bridge electrode 53 is connected with the second gate bridge electrode 54 through a contact hole CH20 at an intermediate point of the second gate bridge electrode 54. A first end of the first gate bridge electrode 55 is connected with the scan gate line GWB1 through a contact hole CH21, and a second end of the first gate bridge electrode 53 is connected with the second gate bridge electrode 56 through a contact hole CH22 at an intermediate point of the second gate bridge electrode 56. A first end of the first gate bridge electrode 57 is connected with the scan gate line GWB1 through a contact hole CH23, and a second end of the first gate bridge electrode 57 is connected with the second gate bridge electrode 56 through a contact hole CH24 at an intermediate point of the second gate bridge electrode 58.

A first end of the first gate bridge electrode 59 is connected with the scan gate line GWC1 through a contact hole CH25, and a second end of the first gate bridge electrode 59 is connected with the second gate bridge electrode 60 through a contact hole CH26 at an intermediate point of the second gate bridge electrode 60. A first end of the first gate bridge electrode 61 is connected with the scan gate line GWC1 through a contact hole CH27, and a second end of the first gate bridge electrode 61 is connected with the second gate bridge electrode 62 through a contact hole CH28 at an intermediate point of the second gate bridge electrode 62. A first end of the first gate bridge electrode 63 is connected with the scan gate line GWD1 through a contact hole CH29, and a second end of the first gate bridge electrode 63 is connected with the second gate bridge electrode 64 through a contact hole CH30 at an intermediate point of the second gate bridge electrode 64. A first end of the first gate bridge electrode 65 is connected with the scan gate line GWD1 through a contact hole CH31, and a second end of the first gate bridge electrode 65 is connected with the second gate bridge electrode 66 through a contact hole CH30 at an intermediate point of the second gate bridge electrode 64.

Although, in the embodiments described thus far, the pixel circuit is described as a structure that includes seven transistors and one capacitor, the present invention is not limited thereto or thereby. For example, some embodiments may be applied to a structure that can control the data write operation for a plurality of pixels on a pixel row by two scanning gate lines.

Although example embodiments of the present invention have been described, it is understood that the present invention is not limited to these example embodiments, but various changes and modifications can be made by one of ordinary skill in the art within the spirit and scope of the present invention as hereinafter claimed.

Therefore, the disclosed subject matter is not be limited to any single embodiment described herein, and the above-described embodiments are to be considered illustrative and not restrictive. Accordingly, the scope of the present inventive concept shall be determined only according to the attached claims, and equivalents thereof.

DESCRIPTION OF SYMBOLS

1: display device
10: display unit
20: signal controller
30: source driver
40: gate driver

What is claimed is:
1. A display device comprising:
a plurality of pixels;
a first scan gate line configured to transfer a first scan signal to first pixel groups from among the plurality of pixels;
a plurality of first gate bridges connected with the first scan gate line to transfer the first scan signal to the first pixel groups, each of the first gate bridges being connected to two of the pixels of a respective one of the first pixel groups; and
a plurality of first data lines configured to supply a plurality of data voltages corresponding to the first pixel groups, wherein two of the first data lines are positioned between two of the pixels connected to a same one of the first gate bridges.

2. The display device of claim 1, further comprising:
a second scan gate line configured to transfer a second scan signal to second pixel groups from among the plurality of pixels;
a plurality of second gate bridges connected with the second scan gate line to transfer the second scan signal to the second pixel groups, each of the second gate bridges being connected to two of the pixels of a respective one of the second pixel groups; and
a plurality of second data lines configured to supply a plurality of data voltages corresponding to the second pixel groups,
wherein two of the second data lines are positioned between two of the pixels connected to a same one of the second gate bridges.

3. The display device of claim 2, wherein
the first pixel groups and the second pixel groups are located at a same pixel row.

4. The display device of claim 3, further comprising:
a third scan gate line configured to transfer a third scan signal to third pixel groups from among the plurality of pixels, wherein the third pixel groups are located at a different pixel row from the first and the second pixel groups;
a plurality of third gate bridges connected with the third scan gate line to transfer the third scan signal to the third pixel groups, each of the third gate bridges being connected to two of the pixels of a respective one of the third pixel groups; and
a plurality of third data lines configured to supply a plurality of data voltages corresponding to the third pixel groups,
wherein two of the third data lines are positioned between two of the pixels connected to a same one of the third gate bridges.

5. The display device of claim 4, further comprising:
a fourth scan gate line configured to transfer a fourth scan signal to fourth pixel groups from among the plurality of pixels, wherein the fourth pixel groups and the third pixel groups are located at the same pixel row;
a plurality of fourth gate bridges connected with the fourth scan gate line to transfer the fourth scan signal to the fourth pixel groups, each of the fourth gate bridges being connected to two of the pixels of a respective one of the fourth pixel groups; and
a plurality of fourth data lines configured to supply a plurality of data voltages corresponding to the fourth pixel groups,
wherein two of the fourth data lines are positioned between two of the pixels connected to a same one of the fourth gate bridges.

6. The display device of claim 5, wherein
the first scan signal and the second scan signal are enabled at different timings.

7. The display device of claim 6, wherein
an enable period of the first scan signal overlaps an enable period of the second scan signal.

8. The display device of claim 7, wherein
the third scan signal and the fourth scan signal are enabled at different timings.

9. The display device of claim 8, wherein
an enable period of the third scan signal overlaps an enable period of the fourth scan signal.

10. The display device of claim 9, wherein
the enable period of the second scan signal overlaps the enable period of the third scan signal.

11. The display device of claim 5,
wherein the first pixel groups and the second pixel groups are alternately positioned at a first pixel row, and the third pixel groups and the fourth pixel groups are alternately positioned at a second pixel row.

12. The display device of claim 11,
wherein each of the third pixel groups is shifted by one pixel in a first direction based on a column direction of the pixels as compared with an adjacent one of the first pixel groups, and each of the fourth pixel groups is shifted by one pixel in the first direction based on the column direction of the pixels as compared with an adjacent one of the second pixel groups.

13. The display device of claim 1,
wherein each of the first gate bridges is positioned along a first direction to include a first gate bridge electrode connected with the first scan gate line, and
wherein a second gate bridge electrode is positioned along a second direction in which the first scan gate line extends and is connected with the first gate bridge electrode.

14. The display device of claim 13,
wherein a node where the first gate bridge electrode and the first scan gate line are connected with each other is between two adjacent ones of the first data lines, and
wherein the two adjacent ones of the first data lines are positioned at a side of corresponding two first pixels from among the plurality of pixels.

15. The display device of claim 13, wherein a node where the first gate bridge electrode and the first scan gate line are connected with each other is positioned in a pixel area corresponding to a first pixel positioned at a first side from among corresponding two first pixels of the plurality of pixels.

16. The display device of claim 15, wherein the node is positioned between a data line adjacent to the first pixel positioned at the first side from among the first data lines and a transistor that uses the second gate bridge electrode as a gate electrode.

17. The display device of claim 16, wherein the transistor is to diode-connect a driving transistor of the first pixel depending on a scan signal transferred through the first scan gate line.

18. The display device of claim 13,
wherein a first end of the first gate bridge electrode is connected with the first scan gate line,
wherein a second end of the first gate bridge electrode is connected with a first end of the second gate bridge electrode, and
wherein the second gate bridge electrode serves as a gate electrode of a transistor connected with each of two corresponding first data lines from among the plurality of first data lines.

19. The display device of claim 13,
wherein a first end of the first gate bridge electrode is connected with the first scan gate line, and
wherein a second end of the first gate bridge electrode is connected with the second gate bridge electrode at an intermediate point of the second gate bridge electrode.

20. The display device of claim 19, wherein a node where the first gate bridge electrode and the first scan gate line are connected with each other is positioned between two first data lines from among the plurality of first data lines.

* * * * *